(12) United States Patent
Kelkar

(10) Patent No.: US 11,009,794 B2
(45) Date of Patent: May 18, 2021

(54) ANTI-REFLECTION OPTICAL SUBSTRATES AND METHODS OF MANUFACTURE

(71) Applicant: ASML Holding N.V., Veldhoven (NL)

(72) Inventor: Parag Vinayak Kelkar, Danbury, CT (US)

(73) Assignee: ASML Holding N.V., Veldhoven (NL)

(*) Notice: Subject to any disclaimer, the term of this patent is extended or adjusted under 35 U.S.C. 154(b) by 0 days.

(21) Appl. No.: 16/292,771

(22) Filed: Mar. 5, 2019

(65) Prior Publication Data

US 2019/0278179 A1  Sep. 12, 2019

Related U.S. Application Data

(60) Provisional application No. 62/639,063, filed on Mar. 6, 2018.

(51) Int. Cl.

| | | |
|---|---|---|
| *G03F 7/09* | (2006.01) | |
| *H01L 21/027* | (2006.01) | |
| *G02B 1/113* | (2015.01) | |
| *H01L 21/311* | (2006.01) | |
| *G02B 1/118* | (2015.01) | |
| *G03F 7/20* | (2006.01) | |
| *G03F 1/46* | (2012.01) | |
| *B82Y 40/00* | (2011.01) | |

(52) U.S. Cl.
CPC .............. *G03F 7/091* (2013.01); *G02B 1/113* (2013.01); *G02B 1/118* (2013.01); *G03F 1/46* (2013.01); *G03F 7/2008* (2013.01); *G03F 7/70958* (2013.01); *H01L 21/0276* (2013.01); *H01L 21/31138* (2013.01); *B82Y 40/00* (2013.01)

(58) Field of Classification Search
CPC ........... B82Y 40/00; G02B 1/11; G02B 1/113; G02B 1/118; G03F 1/46; G03F 7/091; G03F 7/2008; G03F 7/70958; H01L 21/0276; H01L 21/31138
USPC ...................... 355/67, 71; 359/359, 601, 722
See application file for complete search history.

(56) References Cited

U.S. PATENT DOCUMENTS

| | | |
|---|---|---|
| 2003/0180476 A1 | 9/2003 | Yamashita et al. |
| 2008/0130122 A1 | 6/2008 | Egi et al. |
| 2009/0253227 A1 | 10/2009 | Defries et al. |

(Continued)

FOREIGN PATENT DOCUMENTS

| | | | |
|---|---|---|---|
| TW | 201228010 A | 7/2012 | |
| TW | I610087 B | 1/2018 | |
| WO | WO-2019170357 A1 * | 9/2019 | ............. G03F 7/091 |

OTHER PUBLICATIONS

Bruynooghe et al. "Broadband and wide-angle hybrid antireflection coatings prepared by combining interference multilayers with subwavelength structures," J. Nanophoton. 10(3) 033002 (Feb. 3, 2016) (Year: 2016).*

(Continued)

*Primary Examiner* — Colin W Kreutzer
(74) *Attorney, Agent, or Firm* — Pillsbury Winthrop Shaw Pittman LLP

(57) ABSTRACT

A substrate provided with an anti-reflective coating where the anti-reflective coating is made up of a layer of nanostructures. The nanostructures may be formed by depositing a material such as SiO2 and then using a process such as reactive ion etching in conjunction with an inductively coupled plasma source. Other aspects of the fabrication process are also disclosed.

22 Claims, 8 Drawing Sheets

(56) References Cited

U.S. PATENT DOCUMENTS

| | | |
|---|---|---|
| 2010/0117108 A1 | 5/2010 | Gaebler et al. |
| 2010/0149510 A1 | 6/2010 | Zaczek et al. |
| 2010/0259823 A1 | 10/2010 | Xi et al. |
| 2010/0307553 A1 | 12/2010 | Defries et al. |
| 2011/0019277 A1 | 1/2011 | Sager et al. |
| 2013/0182328 A1* | 7/2013 | Stewart .................. G02B 1/18 359/580 |
| 2019/0271799 A1* | 9/2019 | Sosnowski ............... G02B 1/12 |

OTHER PUBLICATIONS

Boden et al. Moth-Eye Anti-Reflective Structures. Encyclopedia of Nanotechnology pp. 1467-1477, 2012, internet. (Year: 2012).*
Office Action issued in TW Patent Application No. 108106143, dated Dec. 12, 2019, 19 pages (with English-language translation).
Diedenhofen et al. "Broad-band and Omnidirectional Antireflection Coatings Based on Semicondutor Nanorods" Adv. Mater vol. 21 No. 9 (2009) p. 973-978.
Xi et. al "Optical Thin-Film Materials with Low Refractive Index for Broadband Elimination of Fresnel Reflection", Nature Photonics, vol. 1 (2007) p. 176-179.

* cited by examiner

ANTI-REFLECTION OPTICAL SUBSTRATES AND METHODS OF MANUFACTURE

CROSS-REFERENCE TO RELATED APPLICATIONS

This application claims the benefit of U.S. Provisional Application No. 62/639,063, filed Mar. 6, 2018, which is herein incorporated by reference.

FIELD

The present disclosure relates to substrates having an anti-reflective surface as used, for example, in optical elements in tools used for the manufacture of devices using photolithographic techniques.

BACKGROUND

A lithographic apparatus can be used, for example, in the manufacture of integrated circuits (ICs). For that application, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning" direction) while synchronously scanning the substrate parallel or anti-parallel to this direction. It is also possible to transfer the pattern from the patterning device to the substrate by imprinting the pattern onto the substrate.

There are various techniques for making measurements of the microscopic structures formed in lithographic processes, including the use of scanning electron microscopes and various specialized tools. One form of specialized inspection tool is a scatterometer in which a beam of radiation is directed onto a target on the surface of the substrate and properties of the scattered or reflected beam are measured. By comparing the properties of the beam before and after it has been reflected or scattered by the substrate, various properties of the substrate can be determined. This can be done, for example, by comparing the reflected beam with data stored in a library of known measurements associated with known substrate properties. Two main types of scatterometer are known. Spectroscopic scatterometers direct a broadband radiation beam onto the substrate and measure the spectrum (intensity as a function of wavelength) of the radiation scattered into a particular narrow angular range. Angularly resolved scatterometers use a monochromatic radiation beam and measure the intensity of the scattered radiation as a function of angle. Included in this latter category are interferometric approaches that use phase information of diffracted orders of the radiation beam.

These and other applications within the tool require the use of various types of optical components. It is advantageous to provide the surfaces of these optical components with anti-reflection (AR) coatings to reduce unwanted reflections. Physical vapor deposition is a common method for depositing AR coatings on optical surfaces. In such coatings, thin layers of materials with different refractive indexes are deposited on the surface to achieve a low overall reflectivity. For practical purposes, often only a few materials are used in the coating process. As a result, these multilayer coatings have limited wavelength bandwidth (e.g. 450-700 nm for visible applications) and limited angle of incidence range (0 to 30 degrees) in which they are effective and have reflection values less than 0.5%.

There is thus a need to be able to provide an anti-reflective coating that is effective over a wider range of wavelengths and over a wider range of incident angles.

SUMMARY

The following presents a simplified summary of one or more embodiments in order to provide a basic understanding of the embodiments. This summary is not an extensive overview of all contemplated embodiments, and is not intended to identify key or critical elements of all embodiments nor delineate the scope of any or all embodiments. Its sole purpose is to present some concepts of one or more embodiments in a simplified form as a prelude to the more detailed description that is presented later.

According to one aspect of an embodiment, there is disclosed an apparatus comprising a substrate and a plurality of layers deposited on the substrate, the plurality of layers comprising at least a first layer adjacent the substrate and a second layer comprising an antireflective coating having a graded refractive index, the antireflective coating comprising a plurality of nanostructures etched in the second layer, the second layer comprising $SiO_2$. The plurality of layers may comprise a plurality of alternating stack layers between the first layer and the second layer, the plurality of alternating stack layers comprising a first stack layer comprising a first material having a first index of refraction and a second stack layer comprising a second material having a second index of refraction lower than the first index of refraction. The first material may comprise, for example, $Ta_2O_5$, $Nb_2O_5$, $TiO_2$, $HfO_2$, $ZrO_2$, or $Al_2O_3$. The second material may comprise $SiO2$. The second layer may be etched using reactive ion etching. The reactive ion etching may use a combination of a fluorocarbon compound and $O_2$. The etching using reactive ion etching may include use of an inductively coupled plasma source.

According to another aspect of an embodiment, there is disclosed a method of making a substrate having an anti-reflection coating, the method comprising the steps of providing a substrate, depositing a plurality of layers on the substrate, the plurality of layers comprising at least a top layer comprising $SiO2$, and etching nanostructures in the top layer to produce an antireflective coating having a graded refractive index. The step of etching nanostructures in the top layer may comprise using reactive ion etching. The step of etching nanostructures in the top layer using reactive ion etching may comprise using a combination of a fluorocarbon compound and $O_2$. The step of etching nanostructures in the top layer using reactive ion etching may comprise using an inductively coupled plasma source. The step of depositing a plurality of layers on the substrate may comprise depositing a plurality of alternating stack layers on the substrate before depositing the top layer, the plurality of alternating stack layers comprising a first stack layer comprising a first material having a first index of refraction and a second stack layer comprising a second material having a second index of refraction lower than the first index of refraction. The first material may comprise, for example, $Ta_2O_5$, $Nb_2O_5$, $TiO_2$, HfO2, ZrO2, or Al2O3. The step of etching nanostructures in the top layer using reactive ion etching may comprise a step of loading the substrate on an electrode of a reactive ion etcher, the electrode comprising anodized aluminum. The step of etching nanostructures in the top layer using reactive ion etching may comprise a steps of loading the substrate on an electrode of a reactive ion etcher, the electrode comprising anodized aluminum, cleaning a top surface of the top layer substrate with plasma, and etching nanostructures in the top layer.

According to another aspect of an embodiment, there is disclosed an optical element for use in photolithographic device, the optical element comprising a plurality of layers deposited on the substrate, the plurality of layers comprising at least a first layer and a second layer comprising an antireflective coating having a graded refractive index, the antireflective coating comprising a plurality of nanostructures etched in the second layer, the second layer comprising $SiO_2$.

According to another aspect of an embodiment, there is disclosed an apparatus comprising a substrate and at least one layer deposited on the substrate, the at least one layer comprising an antireflective coating having a graded refractive index, the antireflective coating comprising a plurality of nanostructures etched in the second layer, the second layer comprising $SiO_2$.

According to another aspect of an embodiment, there is disclosed a method of making a substrate having an antireflection coating, the method comprising the steps of providing a substrate, depositing at one layer comprising SiO2; and etching nanostructures in the at least one layer to produce an antireflective coating having a graded refractive index.

Further embodiments, features, and advantages of the present invention, as well as the structure and operation of the various embodiments are described in detail below with reference to accompanying drawings.

BRIEF DESCRIPTION OF THE DRAWING

The accompanying drawings, which are incorporated herein and form part of the specification, illustrate the methods and systems of embodiments of the invention by way of example, and not by way of limitation. Together with the detailed description, the drawings further serve to explain the principles of and to enable a person skilled in the relevant art(s) to make and use the methods and systems presented herein. In the drawings, like reference numbers indicate identical or functionally similar elements.

DETAILED DESCRIPTION

Figure 1:
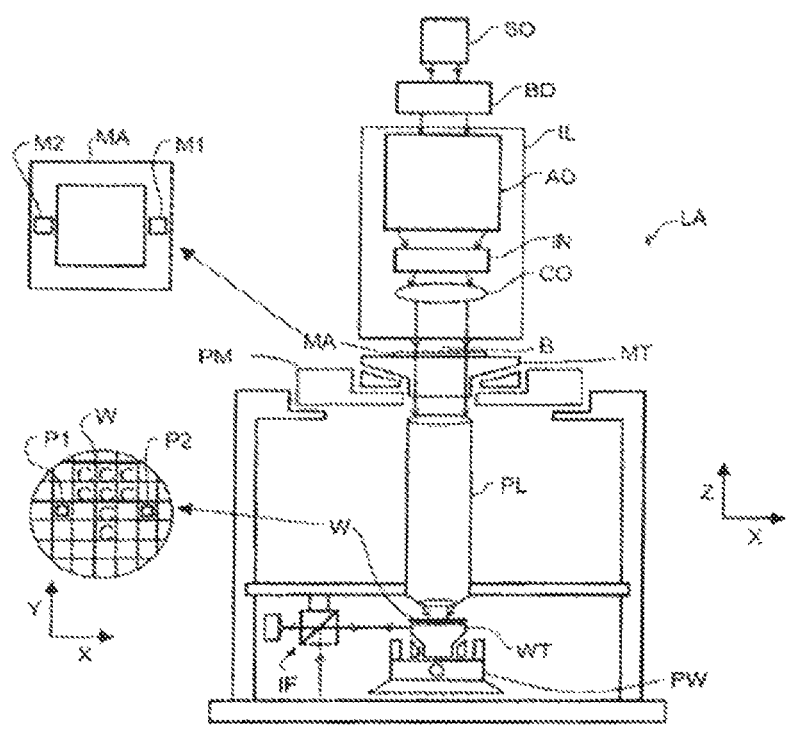
FIG. 1 is a schematic diagram of a photolithography system such as could be used to according to aspects of an embodiment disclosed herein.

Various embodiments are now described with reference to the drawings, wherein like reference numerals are used to refer to like elements throughout. In the following description, for purposes of explanation, numerous specific details are set forth in order to promote a thorough understanding of one or more embodiments. It may be evident in some or all instances, however, that any embodiment described below can be practiced without adopting the specific design details described below. In other instances, well-known structures and devices are shown in block diagram form in order to facilitate description of one or more embodiments. The following presents a simplified summary of one or more embodiments in order to provide a basic understanding of the embodiments. This summary is not an extensive overview of all contemplated embodiments, and is not intended to identify key or critical elements of all embodiments nor delineate the scope of any or all embodiments.

Before describing such embodiments in more detail, however, it is instructive to present an example environment in which embodiments of the present invention may be implemented. In the description that follows and in the claims the terms "up," "down," "top," "bottom," "vertical," "horizontal," and like terms may be employed. These terms are intended to show relative orientation and/or position only and not any absolute orientation such as orientation with respect to gravity unless otherwise indicated.

FIG. 1 schematically depicts a lithographic apparatus. The apparatus comprises an illumination system (illuminator) IL configured to condition a radiation beam B (e.g., UV radiation or DUV radiation), a support structure (e.g., a mask table) MT constructed to support a patterning device (e.g., a mask) MA and connected to a first positioner PM configured to accurately position the patterning device in accordance with certain parameters, a substrate table (e.g., a wafer table) WT constructed to hold a substrate (e.g., a resist-coated wafer) W and connected to a second positioner PW configured to accurately position the substrate in accordance with certain parameters, and a projection system (e.g., a refractive projection lens system) PL configured to project a pattern imparted to the radiation beam B by patterning device MA onto a target portion C (e.g., comprising one or more dies) of the substrate W.

The illumination system may include various types of optical components, such as refractive, reflective, electromagnetic, electrostatic or other types of optical components, or any combination thereof, for directing, shaping, or controlling radiation.

The support structure supports, i.e., bears the weight of, the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water (1.33 at 589.29 nm) so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring again to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PL, which focuses the beam onto a target portion C of the substrate W. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW.

Figure 2:
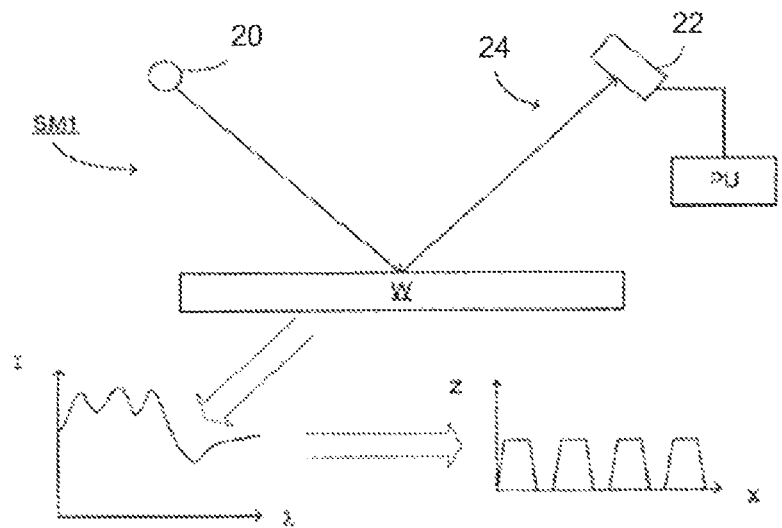
FIG. 2 is a schematic diagram of a scanning portion of the photolithography system of FIG. 1.

FIG. 2 depicts a scatterometer SM1 which may be used in the present invention. It comprises a broadband (white light) radiation projector 20 which projects radiation onto a substrate W. The reflected radiation is passed to a spectrometer detector 22, which measures a spectrum 24 (intensity as a function of wavelength) of the specular reflected radiation. From this data, the structure or profile giving rise to the detected spectrum may be reconstructed by processing unit PU, e.g., by rigorous coupled wave analysis and non-linear regression or by comparison with a library of simulated spectra as shown at the bottom of FIG. 2. In general, for the reconstruction the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

Figure 3:
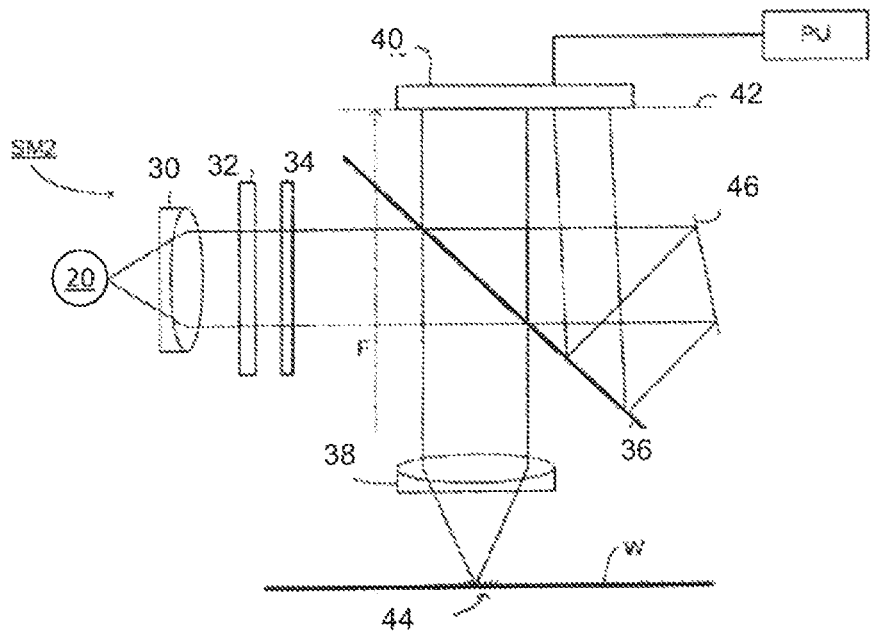
FIG. 3 is a schematic diagram of an alternative scanning portion of the photolithography system of FIG. 1.

Another scatterometer SM2 that may be used with the present invention is shown in FIG. 3. In this device, the radiation emitted by radiation source 2 is focused using lens system 30 through interference filter 32 and polarizer 34, reflected by partially reflected surface 36 and is focused onto substrate W via a microscope objective lens 38, which has a high numerical aperture (NA), preferably at least 0.9 and more preferably at least 0.95. Immersion scatterometers may even have lenses with numerical apertures over 1. The reflected radiation then transmits through partially reflective surface 36 into a detector 40 in order to have the scatter spectrum detected. The detector may be located in the back-projected pupil plane 42, which is at the focal length of the lens system 38, however the pupil plane may instead be re-imaged with auxiliary optics (not shown) onto the detector. The pupil plane is the plane in which the radial position of radiation defines the angle of incidence and the angular position defines azimuth angle of the radiation. The detector is preferably a two-dimensional detector so that a two-dimensional angular scatter spectrum of a substrate target 44 can be measured. The detector 40 may be, for example, an array of CCD or CMOS sensors, and may use an integration time of, for example, 40 milliseconds per frame.

A reference beam is often used for example to measure the intensity of the incident radiation. To do this, when the radiation beam is incident on the beam splitter 36 part of it is transmitted through the beam splitter as a reference beam towards a reference mirror 46. The reference beam is then projected onto a different part of the same detector 40.

A set of interference filters may be is available to select a wavelength of interest in the range of, for example, 405-790 nm or even lower, such as 200-300 nm. The interference filter may be tunable rather than comprising a set of different filters. A grating could be used instead of interference filters.

The detector 40 may measure the intensity of scattered light at a single wavelength (or narrow wavelength range), the intensity separately at multiple wavelengths or integrated over a wavelength range. Furthermore, the detector may separately measure the intensity of transverse magnetic— and transverse electric-polarized light and/or the phase difference between the transverse magnetic—and transverse electric-polarized light.

Using a broadband light source (i.e., one with a wide range of light frequencies or wavelengths—and therefore of colors) is possible, which gives a large etendue, allowing the mixing of multiple wavelengths. The plurality of wavelengths in the broadband preferably each has a bandwidth of $\Delta\lambda$, and a spacing of at least $2\Delta\lambda$ (i.e., twice the bandwidth). Several "sources" of radiation can be different portions of an extended radiation source which have been split using fiber bundles. In this way, angle resolved scatter spectra can be measured at multiple wavelengths in parallel. A 3-D spectrum (wavelength and two different angles) can be measured, which contains more information than a 2-D spectrum. This allows more information to be measured which increases metrology process robustness. This is described in more detail in EP 1,628,164A, which is incorporated by reference herein in its entirety.

The target 30 on substrate W may be, for example, (a) a resist layer grating, which is printed such that after development, the bars are formed of solid resist lines, or (b) a product layer grating, or (c) a composite grating stack in an overlay target structure comprising a resist grating overlaid or interleaved on a product layer grating. The bars may alternatively be etched into the substrate. This pattern is sensitive to chromatic aberrations in the lithographic projection apparatus, particularly the projection system PL, and illumination symmetry and the presence of such aberrations will manifest themselves in a variation in the printed grating. Accordingly, the scatterometry data of the printed gratings is used to reconstruct the gratings. The parameters of the grating, such as line widths and shapes, may be input to the reconstruction process, performed by processing unit PU, from knowledge of the printing step and/or other scatterometry processes.

In other words, a powerful light source beams light through a mark on a reticle. The light lands upon the gratings in the mark, e.g., TIS or PARIS plate. For example, the ASML PAS 5500 uses wafer alignment marks that are diffraction gratings. There are marks for both the x and y directions. These marks are illuminated with a HeNe laser at a single wavelength near 632.8 nm. The reflected wave exhibits a diffraction pattern of bright and dark lines that are focused on a sensor. The stage is moved slightly to learn the best position to match the sensor and that stage position is used to calculate the stage position to place the die under the center of the optical column.

The data can for example be obtained with any type of alignment sensor, for example a SMASH (SMart Alignment Sensor Hybrid) sensor, as described in U.S. Pat. No. 6,961,116, which is incorporated by reference herein in its entirety, that employs a self-referencing interferometer with a single detector and four different wavelengths, and extracts the alignment signal in software, or ATHENA (Advanced Technology using High order ENhancement of Alignment), as described in U.S. Pat. No. 6,297,876, which is incorporated by reference in its entirety, which directs each of seven diffraction orders to a dedicated detector.

The system may include additional component such as a metrology platform, for example, YieldStar, which is based on an angle-resolved high-NA scatterometer and can measure overlay, CD, and focus in a single measurement.

Systems such as those just described use a variety of optical elements. These optical elements are in general made of a substrate material called an optical substrate that is coated, shaped, etc., to create an optical element. In general it is desired to provide the optical element with an anti-reflective coating that reduces unwanted reflections. It is desirable that anti-reflective coatings work over a wide range of wavelengths and incident angles. Such low reflectivity also increase transmission through the optics. The materials use for coating or the nanostructured/etched layer have negligible absorption and scattering. Thus by optimizing reflection, transmission is also optimized.

One type of anti-reflective coating has graded refractive index, where the refractive index of the coating changes either continuously or in very small steps from the refractive index of the substrate to the refractive index of the incident medium, typically air. Such anti-reflective coating will have close to 0% reflection over a very wide wavelength band and over wide angle of incidence range.

According to one aspect, the surface of the optical component comprises a material such as $SiO_2$. It has been determined that $SiO_2$ can be etched in a manner that creates a layer of nanostructures (structures with a submicron length, width, or both) in the surface of the $SiO_2$. The layer can be made to exhibit an index of refraction that changes gradually from the bottom to the top (exposed portion) of the layer. The nanostructures are randomly distributed and of random shapes and sizes, with some in the shapes of pyramids and others in the shapes of rods or cones.

Figure 4A:
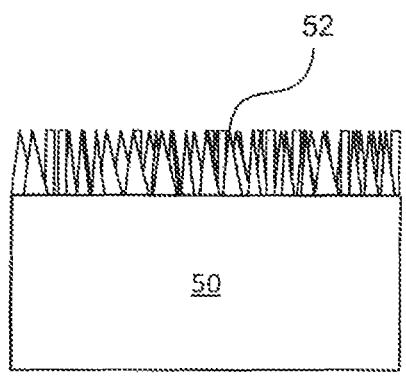
FIGS. 4A, 4B and 4C are diagrams of substrates with an anti-reflective coatings according to aspects of an embodiment disclosed herein.

FIG. 4A shows an instance in which the substrate 50 itself is made of a material such as fused silica. In such a case, the nanolayer (layer of nanostructures) 52 may be etched directly onto to the substrate 50. In the figures, the size of the nanostructures relative to the thickness of the other layers is exaggerated for purposes of illustration.

Figure 4B:
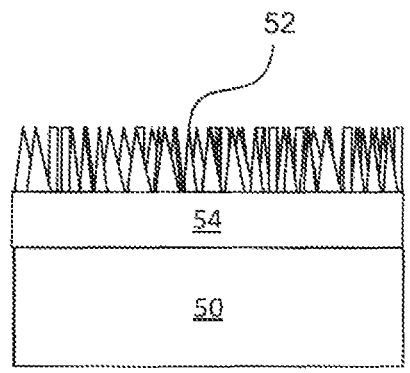

FIG. 4B shows an instance in which the substrate is provided with a layer 54 comprising a material such as $SiO_2$ which is then etched to create nanolayer 52. The nanostructures in nanolayer 52 have the effect of creating a graded refractive index starting with the refractive index of the layer beneath the top layer and ending with a lower index.

Figure 4C:
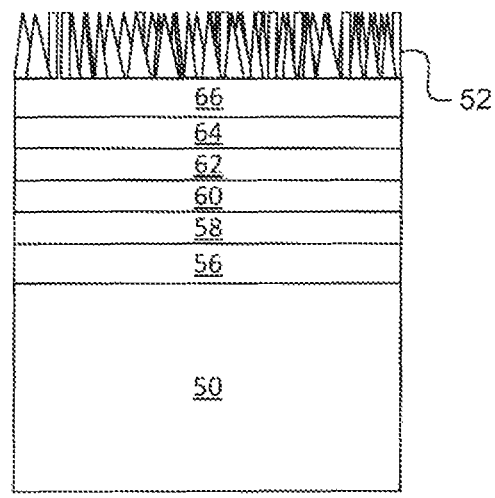

FIG. 4C depicts an optical element made up of an optical substrate 50. Layers 56, 58, 60, 62, 64, and 66 are on top of the substrate 50. The layers may be layers of materials having indexes of refraction alternating between higher and lower. For example, layers of higher index materials such as $Ta_2O_5$, $Nb_2O_5$, $TiO_2$, $HfO_2$, $ZrO_2$, or $Al_2O_3$ may be alternated with layers of a lower index material such as $SiO_2$. "Higher" and "lower" are used herein to indicate relative indexes, that is, the index of refraction of materials in one of the alternating layers is higher than the index of refraction of the materials used in the other of the alternating layers.

The top layer 52 is a layer of a material such as SiO2 that has been etched to create nanostructures. These nanostructures will in general have a pyramid or rod-like structure that is randomly distributed. Particularly, for the example of SiO2 (silica) in the coating deposited on the surface, the SiO2 may be selectively etched using a fluorocarbon compound or a combination of fluorocarbon compounds, e.g. CHF3, CH2F2, C4F6, C4F8 or CF4, and O2 plasma in reactive ion etching (RIE) equipment. The production of ions in RIE equipment can be assisted by the use of an inductively coupled plasma (ICP) source. The layer 52 may be conceptualized as a layer added above the stack or as the uppermost layer of the stack, although in general the layer 52 will be thicker than the layers in the stack. FIG. 4C shows an arrangement with a stack of six layers and an additional top layer, but one of ordinary skill in the art will appreciate that any number of layers may be used, and their thicknesses may be chosen, to optimize the reduction of reflectivity of the surface of the optical element.

The stack layers may be deposited with conventional physical vapor deposition. The layer 52 can also be deposited with physical vapor deposition and may have a thickness in the range of about 100 nm to about 500 nm.

In general, the optical properties of the stack may be altered by changing thicknesses, materials, number of layers, etc. These parameters may be reverse engineered to create a stack that has optical properties that are best matched to the layer 52 so that the combination of the stack and the nanolayer results in the lowest reflectivity. The layer 52 is etched to create nanostructures and thus to create favorable graded index profile to achieve low reflection from the combination of the stack. The thickness and composition of the deposited stack are adjusted such that when nanostructures are etched using RIE or combination of ICP/RIE in the top layer low reflection is achieved from the entire stack. For a fused silica substrate, such base layers of the coating stack are not required and the substrate is directly etched using RIE or combination of ICP/RIE to create a graded refractive index.

Figure 5:
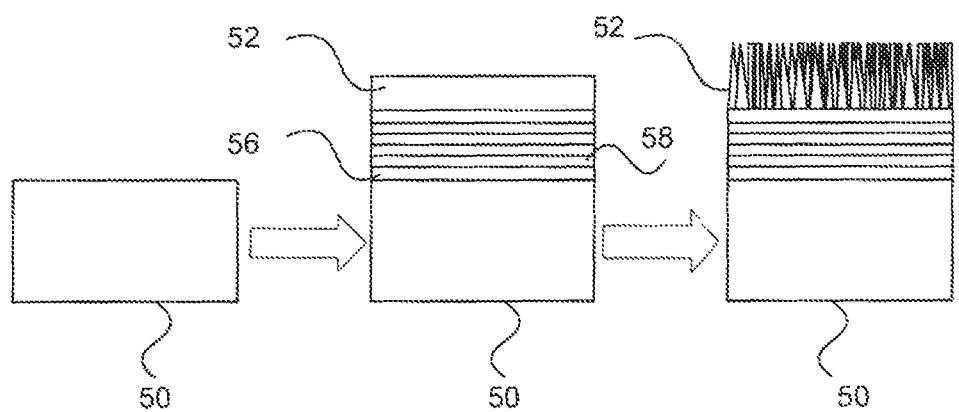
FIG. 5 is a diagram illustrating a method of making a substrate with an anti-reflective coating according to aspects of an embodiment disclosed herein.

A process for making an optical substrate such as that shown in FIG. 4C will now be described in connection with FIG. 5. In the leftmost portion of the figure, the substrate 50 is prepared to receive the coating stack. In the center portion a coating stack including layers 56 and 58 is deposited on the substrate 50, with the layers having respective indices of refraction alternating between lower and higher, and the top layer 52 being a relatively thicker layer of a material such as SiO2. In the rightmost portion of the figure the topmost layer is etched to create nanostructures.

Figure 6:
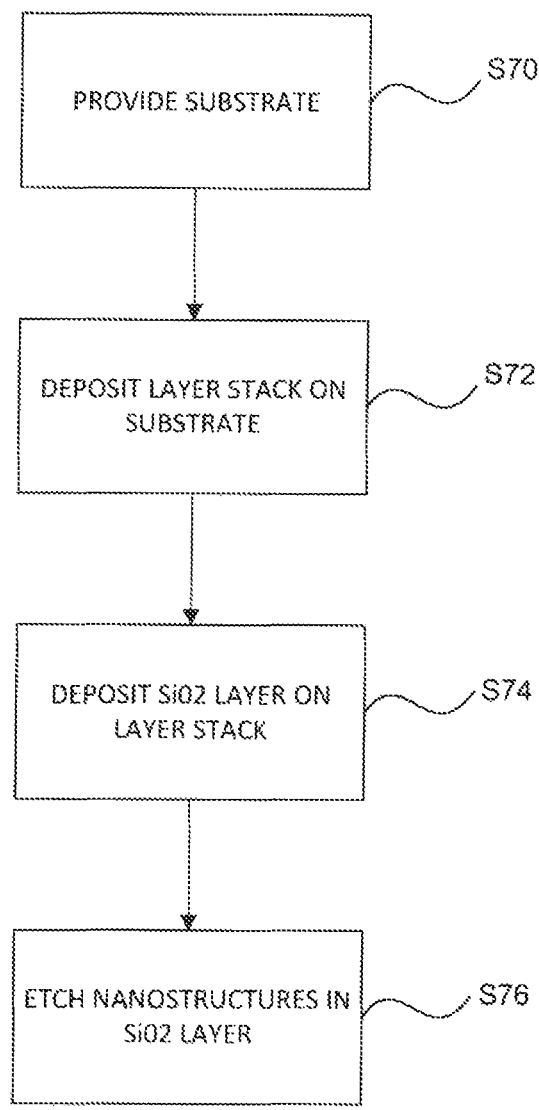
FIG. 6 is a flowchart of a method of making a substrate with an anti-reflective coating according to aspects of an embodiment disclosed herein.

FIG. 6 describes another aspect of an embodiment of the invention. A substrate is provided in a step S70. In a step S72 a layer stack is deposited on the substrate. In a step S74 a layer of SiO2 is deposited on the stack. At this point the substrate and the added layers may be cleaned with an aqueous cleaning process using detergent and a lightly abrasive agent. In a step S76 the substrate is etched in a reactive ion etching chamber. The electrode of the RIE chamber may be made, for example, of aluminum or anodized aluminum. The RIE etching process can be assisted by using an inductively coupled plasma (ICP) source. Before etching the surface of the substrate and the electrode may be cleaned with argon plasma (e.g. pressure of about 10 mTorr to about 50 mTorr, ICP power of about 0 W to about 2000 W, RIE power of about 100 W to about 600 W, Ar flow rate of about 5 sccm (standard cubic centimeters per minute) to about 20 sccm, clean time of about 10 s to about 300 s). The etch depth of the nanostructures and spatial size can be controlled by etching parameters such as gas composition, ICP and/or RIE power, pressure, temperature, and etching time. For etching the coated substrate the process parameters may be, for example, pressure of about 10 mTorr to about 100 mTorr, ICP power of about 0 W to about 2000 W, RIE power of about 100 W to about 600 W, CHF3 flow rate of about 5 sccm to about 100 sccm, O2 flow rate of about 5 sccm to about 100 sccm, and etch time of about 30 s to about 300 s.

Figure 7:
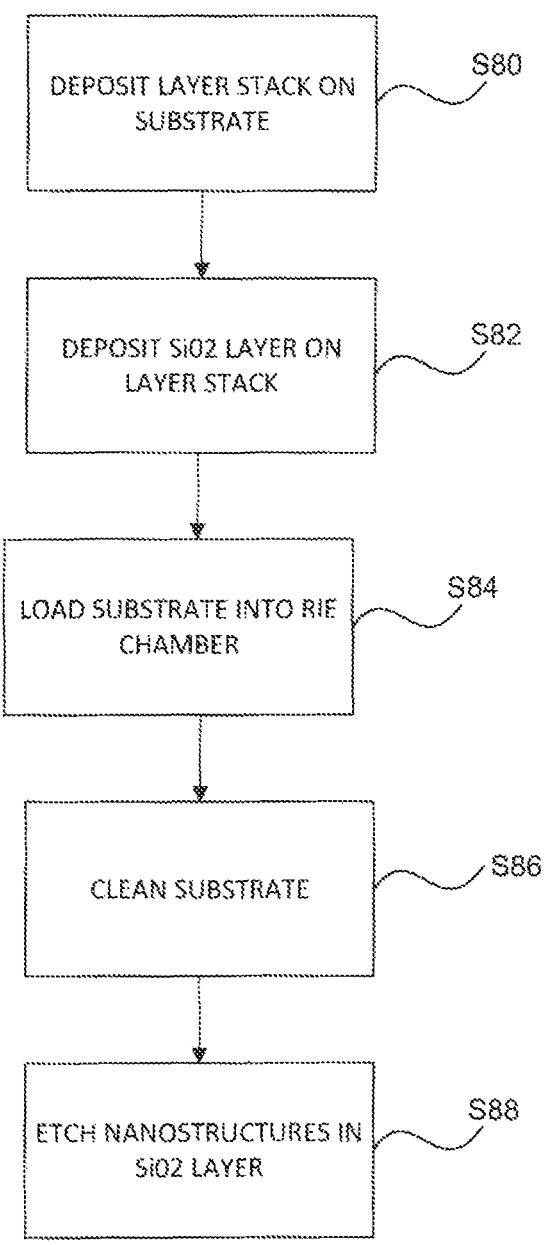
FIG. 7 is a flowchart of a method of making a substrate with an anti-reflective coating according to aspects of an embodiment disclosed herein.

FIG. 7 shows another conceptualization of a process for making a substrate with an anti-reflective coating. In a step S80 a layer stack is deposited on the substrate using, for example, physical vapor deposition. In a step S82 a layer of SiO2 is deposited on the stack using, for example, physical vapor deposition. Again, at this point the substrate and the added layers may be cleaned with an aqueous cleaning process using detergent and a lightly abrasive agent. In a step S84 the coated substrate is loaded into an RIE chamber. The electrode of the RIE chamber may be made, for example, of aluminum or anodized aluminum. The RIE etching process may have an inductively coupled plasma (ICP) source. In a step S86 the substrate and the electrode are be cleaned, for example, with argon plasma (e.g. pressure of about 10 mTorr to about 50 mTorr, ICP power of about 0 W to about 2000 W, RIE power of about 100 W to about 600 W, Ar flow rate of about 5 sccm to about 20 sccm, clean time of about 10 s to about 300 s). Nanostructures are etched into the coated substrate in a step S88. The etch depth of the nanostructures and spatial size can be controlled by etching parameters like gas composition, ICP and/or RIE power, pressure, temperature and etching time. For etching the coated substrate the process parameters may be, for example, pressure 10-100 mTorr, ICP power 0-2000 W, RIE power 100-600 W, CHF3 flow rate 5-100 sccm, O2 flow rate 5-100, etch time 30 s-300 s.

As an example of this process, the substrate may be lead based optical glass such as SF2. The following base layer coating stack starting with layer number 1 may be deposited on the substrate.

| Layer Number | Material | Thickness (nm) |
| --- | --- | --- |
| 1 | SiO2 | 45.3 |
| 2 | TA2O5 | 16.0 |
| 3 | SiO2 | 81.1 |
| 4 | TA2O5 | 28.9 |
| 5 | SiO2 | 40.6 |
| 6 | TA2O5 | 167.0 |
| 7 | SiO2 | 40.1 |
| 8 | TA2O5 | 13.1 |
| 9 | SiO2 | 186.0 |

Figure 8:
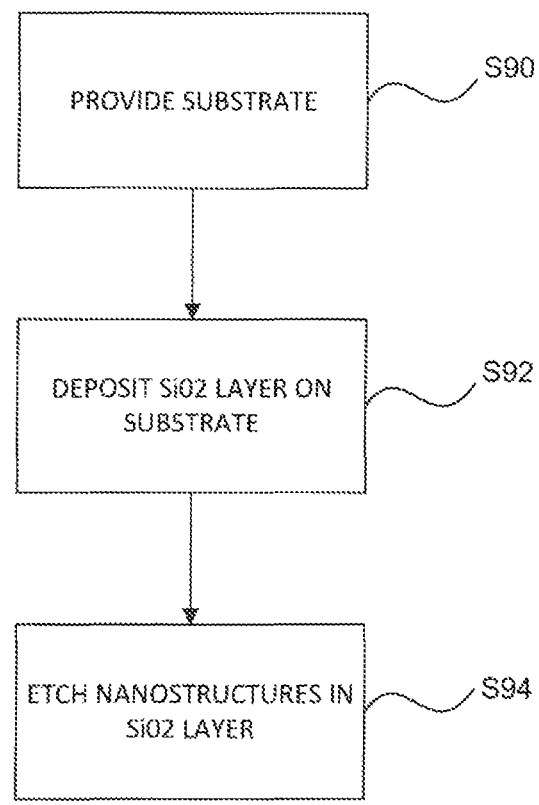
FIG. 8 is a flowchart of a method of making a substrate with an anti-reflective coating according to aspects of an embodiment disclosed herein.

FIG. 8 describes another aspect of an embodiment of the invention. A substrate is provided in a step S90. In a step S92 a layer of SiO2 is deposited on the substrate. At this point the substrate and the layer may be cleaned with an aqueous cleaning process using detergent and a lightly abrasive agent. In a step S76 the layer is etched in a reactive ion etching chamber. The electrode of the RIE chamber may be made, for example, of aluminum or anodized aluminum. The RIE etching process can be assisted by using an inductively coupled plasma (ICP) source. Before etching the surface of the substrate and the electrode may be cleaned with argon plasma (e.g. pressure of about 10 mTorr to about 50 mTorr, ICP power of about 0 W to about 2000 W, RIE power of about 100 W to about 600 W, Ar flow rate of about 5 sccm to about 20 sccm, and clean time of about 10 s to about 300 s). The etch depth of the nanostructures and spatial size can be controlled by etching parameters like gas composition, ICP and/or RIE power, pressure, temperature and etching time. For etching the coated substrate the process parameters may be, for example, pressure of about 10 mTorr to about 100 mTorr, ICP power of about 0 W to about 2000 W, RIE power of about 100 W to about 600 W, CHF3 flow rate of about 5 sccm to about 100 sccm, O2 flow rate of about 5 sccm to about 100 sccm, and etch time of about 30 s to about 300 s.

Figure 9:
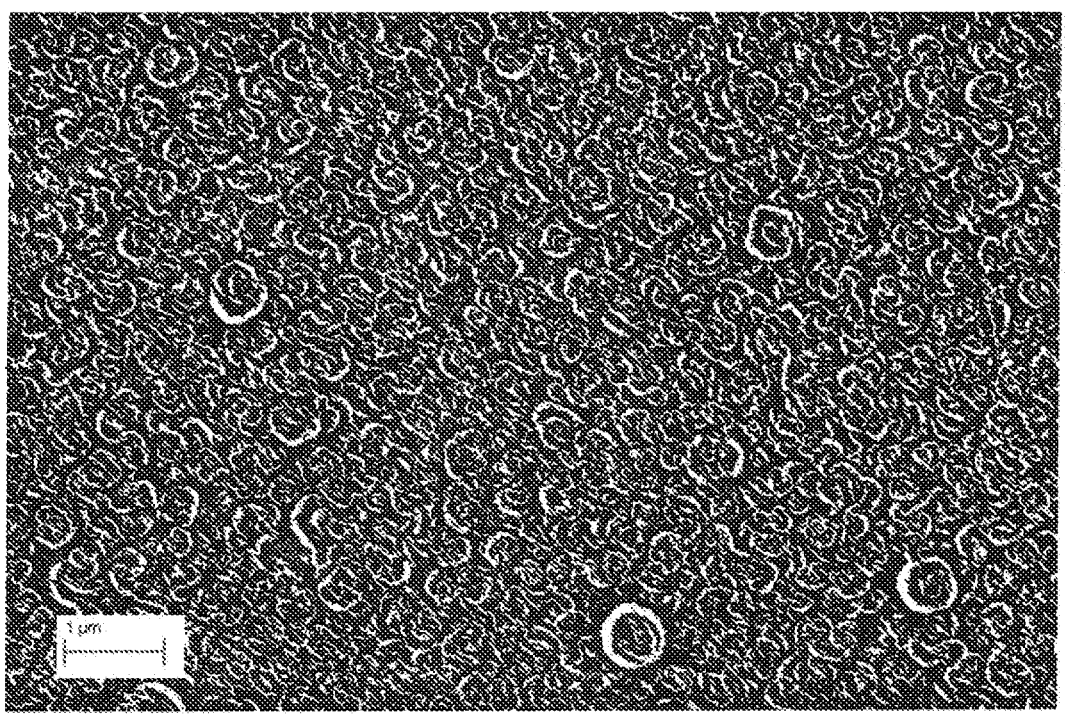
FIG. 9 is a scanning electron micrograph of an antireflective coating according to aspects of an embodiment disclosed herein Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art based on the teachings contained herein.

FIG. 9 is an image obtained using scanning electron microscopy of nanostructures etched in fused silica using a process such as that described above. As can be seen the spatial features are predominantly less than about 100 nm in width and are randomly distributed. The features are generally circular when viewed from above, or arcuate.

The thickness of all the layers is adjusted such that when the top SiO2 layer is etched with nanostructures, it results in low reflection over wide wavelength range. The anti-reflection nanostructure etching process can be adapted to variety of substrates with widely different refractive indices and chemical composition by the addition of a base layer coating stack and subsequent etching of the top silica layer.

In particular, the optimization process may be carried out by first depositing an SiO2 layer on top of a substrate and etching nanostructures in the deposited layer. Reflection measurements are then made on the substrate with nanostructures and commercial software is sued to model the effective refractive index gradient and thickness of the etched structures. This information about the etched nanostructures as the top layer of an underlying stack of high/low refractive index materials is used to optimize the underlying layers with goal of reducing reflection (increasing transmission) for the entire stack over required wavelength and angle of incidence ranges.

The embodiments may further be described using the following clauses:
1. Apparatus comprising:
   a substrate;
   a plurality of layers deposited on the substrate, the plurality of layers comprising at least a first layer adjacent the substrate and a second layer comprising an antireflective coating having a graded refractive index, the antireflective coating comprising a plurality of nanostructures etched in the second layer, the second layer comprising SiO2.
2. Apparatus of clause 1 wherein the plurality of layers comprises a plurality of alternating stack layers between the first layer and the second layer, the plurality of alternating stack layers comprising a first stack layer comprising a first material having a first index of refraction and a second stack layer comprising a second material having a second index of refraction lower than the first index of refraction.
3. Apparatus of clause 2 wherein the first material comprises Ta2O5.
4. Apparatus of clause 2 wherein the first material comprises Nb2O5.
5. Apparatus of clause 2 wherein the first material comprises TiO2.
6. Apparatus of clause 2 wherein the first material comprises HfO2.
7. Apparatus of clause 2 wherein the first material comprises ZrO2.
8. Apparatus of clause 2 wherein the first material comprises Al2O3.
9. Apparatus of clause 2 wherein the second material comprises SiO2.
10. Apparatus of clause 1 wherein the second layer is etched using reactive ion etching.
11. Apparatus of clause 10 wherein the reactive ion etching uses a combination of a fluorocarbon compound and O2.
12. Apparatus of clause 10 wherein the etching using reactive ion etching includes use of an inductively coupled plasma source.
13. A method of making a substrate having an anti-reflection coating, the method comprising the steps of:
   providing a substrate;
   depositing a plurality of layers on the substrate, the plurality of layers comprising at least a top layer comprising SiO2; and
   etching nanostructures in the top layer to produce an antireflective coating having a graded refractive index.
14. A method of clause 13 wherein the step of etching nanostructures in the top layer comprises using reactive ion etching.
15. A method of clause 14 wherein the step of etching nanostructures in the top layer using reactive ion etching comprises using a combination of a fluorocarbon compound and O2.
16. A method of clause 14 wherein the wherein the step of etching nanostructures in the top layer using reactive ion etching comprises using an inductively coupled plasma source.
17. A method of clause 13 wherein the step of depositing a plurality of layers on the substrate comprises depositing a plurality of alternating stack layers on the substrate before depositing the top layer, the plurality of alternating stack layers comprising a first stack layer comprising a first material having a first index of refraction and a second stack layer comprising a second material having a second index of refraction lower than the first index of refraction.
18. A method of clause 17 wherein the first material comprises Ta2O5.
19. A method of clause 17 wherein the first material comprises Nb2O5.
20. A method of clause 17 wherein the first material comprises TiO2.
21. A method of clause 17 wherein the first material comprises HfO2.
22. A method of clause 17 wherein the first material comprises ZrO2.
23. A method of clause 17 wherein the first material comprises Al2O3.
24. A method of clause 14 wherein the step of etching nanostructures in the top layer using reactive ion etching comprises a step of loading the substrate on an electrode of a reactive ion etcher, the electrode comprising anodized aluminum.
25. A method of clause 14 wherein the step of etching nanostructures in the top layer using reactive ion etching comprises a steps of:
   loading the substrate on an electrode of a reactive ion etcher, the electrode comprising anodized aluminum;
   cleaning a top surface of the top layer substrate with plasma; and
   etching nanostructures in the top layer.
26. An optical element for use in photolithographic device, the optical element comprising a plurality of layers deposited on the substrate, the plurality of layers comprising at least a first layer and a second layer comprising an antireflective coating having a graded refractive index, the antireflective coating comprising a plurality of nanostructures etched in the second layer, the second layer comprising SiO2.

27. Apparatus comprising:
   a substrate; and
   at least one layer deposited on the substrate, the at least one layer comprising an antireflective coating having a graded refractive index, the antireflective coating comprising a plurality of nanostructures etched in the second layer, the second layer comprising SiO2.

28. A method of making a substrate having an anti-reflection coating, the method comprising the steps of:
   providing a substrate;
   depositing at one layer comprising SiO2; and
   etching nanostructures in the at least one layer to produce an antireflective coating having a graded refractive index.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The above description includes examples of multiple embodiments. It is, of course, not possible to describe every conceivable combination of components or methodologies for purposes of describing the aforementioned embodiments, but one of ordinary skill in the art may recognize that many further combinations and permutations of various embodiments are possible. Accordingly, the described embodiments are intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is construed when employed as a transitional word in a claim. Furthermore, although elements of the described aspects and/or embodiments may be described or claimed in the singular, the plural is contemplated unless limitation to the singular is explicitly stated. Additionally, all or a portion of any aspect and/or embodiment may be utilized with all or a portion of any other aspect and/or embodiment, unless stated otherwise.

The invention claimed is:

1. An apparatus comprising:
   a substrate; and
   a plurality of layers deposited on the substrate, the plurality of layers comprising at least a nanostructure layer arranged to be antireflective and comprising a plurality of nanostructures etched in the nanostructure layer, the nanostructure layer comprising $SiO_2$ and the nanostructures providing a graded refractive index in the nanostructure layer, wherein the plurality of layers together are configured to have reflection values less than 0.5% for incident radiation throughout a wavelength range of more than 250 nm and having an angle of incidence of more than 30 degrees.

2. The apparatus as claimed in claim 1, wherein the plurality of layers comprises a plurality of alternating stack layers between the substrate and the nanostructure layer, the plurality of alternating stack layers comprising a first stack layer comprising a first material having a first index of refraction and a second stack layer comprising a second material having a second index of refraction lower than the first index of refraction.

3. The apparatus as claimed in claim 2, wherein the first material comprises $Ta_2O_5$.

4. The apparatus as claimed in claim 2, wherein the first material comprises $Nb_2O_5$.

5. The apparatus as claimed in claim 2, wherein the first material comprises $TiO_2$.

6. The apparatus as claimed in claim 2, wherein the first material comprises $HfO_2$.

7. The apparatus as claimed in claim 2, wherein the first material comprises $ZrO_2$.

8. The apparatus as claimed in claim 2, wherein the first material comprises $Al_2O_3$.

9. The apparatus as claimed in claim 2 wherein the second material comprises $SiO_2$.

10. The apparatus as claimed in claim 1, wherein the second layer is reactive ion etched.

11. A method of making an apparatus having a substrate, the method comprising:
    depositing a plurality of layers on the substrate, the plurality of layers comprising at least a top layer comprising $SiO_2$; and
    etching nanostructures in the top layer to form an antireflective nanostructure layer, the nanostructure providing a graded refractive index in the nanostructure layer, wherein the plurality of layers together are configured to have reflection values less than 0.5% for incident radiation throughout a wavelength range of more than 250 nm and having an angle of incidence of more than 30 degrees.

12. The method as claimed in claim 11, wherein the etching nanostructures in the top layer comprises using reactive ion etching.

13. The method as claimed in claim 12, wherein the etching nanostructures in the top layer using reactive ion etching comprises reactive ion etching using a combination of a fluorocarbon compound and $O_2$.

14. The method as claimed in claim 12, wherein the etching nanostructures in the top layer using reactive ion etching comprises reactive ion etching using an inductively coupled plasma source.

15. The method as claimed in claim 11, wherein the depositing a plurality of layers on the substrate comprises depositing a plurality of alternating stack layers on the substrate before depositing the top layer, the plurality of alternating stack layers comprising a first stack layer comprising a first material having a first index of refraction and a second stack layer comprising a second material having a second index of refraction lower than the first index of refraction.

16. The method as claimed in claim 12, wherein the etching nanostructures in the top layer using reactive ion etching comprises loading the substrate on an electrode of a reactive ion etcher, the electrode comprising anodized aluminum.

17. The method as claimed in claim 12, wherein the etching nanostructures in the top layer using reactive ion etching comprises:
    loading the substrate on an electrode of a reactive ion etcher, the electrode comprising anodized aluminum;
    cleaning a top surface of the top layer substrate with plasma; and
    etching nanostructures in the top layer.

18. An optical element for use in a photolithographic device, the optical element comprising a plurality of layers deposited on the substrate, the plurality of layers comprising at least a nanostructure layer arranged to be antireflective and comprising a plurality of nanostructures etched in the nanostructure layer, the nanostructure layer comprising $SiO_2$ and the nanostructures providing a graded refractive index in the nanostructure layer, wherein the plurality of layers are configured to have reflection values less than 0.5% for incident radiation throughout a wavelength range of more than 250 nm and having an angle of incidence of more than 30 degrees.

19. An apparatus comprising:
    a substrate; and
    at least one layer deposited on the substrate, the at least one layer comprising an antireflective coating comprising a plurality of nanostructures, the coating comprising $SiO_2$ and the nanostructures providing a graded refractive index in a layer having the nanostructures, wherein the at least one layer is configured to have reflection values less than 0.5% for incident radiation throughout a wavelength range of more than 250 nm and having an angle of incidence of more than 30 degrees.

20. A method of making an apparatus having a substrate, the method comprising:
    depositing at least one layer comprising SiO2 on a substrate; and
    etching nanostructures in the at least one layer to produce an antireflective coating, the nanostructures providing a graded refractive index in the at least one layer, wherein the at least one layer is configured to have reflection values less than 0.5% for incident radiation throughout a wavelength range of more than 250 nm and having an angle of incidence of more than 30 degrees.

21. The apparatus of claim 1, wherein the nanostructures have a pyramid and/or rod-like shape.

22. The apparatus of claim 19, wherein the nanostructures have a pyramid and/or rod-like shape.

* * * * *